(12) United States Patent
Saint Ramond et al.

(10) Patent No.: US 6,645,351 B2
(45) Date of Patent: Nov. 11, 2003

(54) METHOD OF MAKING A PROTECTIVE COATING FORMING A THERMAL BARRIER WITH A BONDING UNDERLAYER ON A SUPERALLOY SUBSTRATE, AND A PART OBTAINED THEREBY

(75) Inventors: Bertrand Saint Ramond, Villa Murat (FR); John Nicholls, Great Horwood (GB)

(73) Assignee: SNECMA Moteurs, Paris (FR)

( * ) Notice: Subject to any disclaimer, the term of this patent is extended or adjusted under 35 U.S.C. 154(b) by 6 days.

(21) Appl. No.: 09/960,353

(22) Filed: Sep. 24, 2001

(65) Prior Publication Data

US 2002/0037220 A1 Mar. 28, 2002

(30) Foreign Application Priority Data

Sep. 25, 2000 (FR) .............................. 00 12145

(51) Int. Cl.[7] .................. C23C 14/34; B05D 1/36; B05D 7/00
(52) U.S. Cl. ............... 204/192.15; 427/250; 427/255.7; 427/404; 427/405; 427/419.1
(58) Field of Search ...................... 204/192.15, 192.16; 427/250, 255.7, 404, 405, 419.1

(56) References Cited

U.S. PATENT DOCUMENTS 5,292,594 A 3/1994 Liburdi et al. ............. 428/650
5,490,911 A 2/1996 Makowiecki et al. .. 204/192.15
5,856,027 A 1/1999 Murphy ...................... 428/623

FOREIGN PATENT DOCUMENTS

EP 0 985 744 3/2000 ........... C23C/26/00

OTHER PUBLICATIONS

J. R. Nicholls, et al., Proceedings of the 1996 125th TMS Annual Meeting, pp. 199–208, "Platinum Aluminide Diffusion Barrier for the Oxidation Protection of Titanium and Titanium Intermetallic Alloys," Feb. 4–8, 1996 (submitting English Abstract only).

Primary Examiner—Steven H. VerSteeg
(74) Attorney, Agent, or Firm—Oblon, Spivak, McClelland, Maier & Neustadt, P.C.

(57) ABSTRACT

A protective coating forming a thermal barrier is made on a superalloy metal substrate by forming a bonding underlayer on the substrate, the bonding underlayer being constituted by an intermetallic compound comprising at least aluminum and a metal from the platinum group, and by forming a ceramic outer layer which is anchored on a film of alumina present on the surface of the bonding underlayer. The bonding underlayer preferably has a thickness of less than 50 $\mu$m and is made by using physical vapor deposition, e.g. by cathode sputtering, to deposit a plurality of individual layers alternately of aluminum and of a metal from the platinum group, and by causing the metals in the resulting layers to react together exothermally.

26 Claims, 3 Drawing Sheets

METHOD OF MAKING A PROTECTIVE COATING FORMING A THERMAL BARRIER WITH A BONDING UNDERLAYER ON A SUPERALLOY SUBSTRATE, AND A PART OBTAINED THEREBY

BACKGROUND OF THE INVENTION

The invention relates to making parts comprising a metal substrate provided with a protective coating forming a thermal barrier.

The field of application of the invention is making parts capable of retaining their mechanical properties at high temperatures, in particular gas turbine parts such as turbine blades, in particular for turbojet engines.

To improve the performance of gas turbines, and in particular the efficiency thereof, it is desirable to run them at temperatures that are as high as possible. To make parts for the hot portions, it is well known to use superalloys. As a general rule, superalloys comprise nickel as the main component and additional elements usually selected from chromium, cobalt, aluminum, molybdenum, titanium, tantalum, and many others.

Operating temperature can be further increased by providing the metal substrate of such parts with a protective coating that constitutes a thermal barrier.

It is known for this purpose to make a multilayer protective coating comprising an outer layer of ceramic and a metallic bonding underlayer, in particular an underlayer comprising aluminum or some other metal such as platinum.

The bonding underlayer interposed between the superalloy metal substrate and the ceramic outer layer serves to perform the following functions:

enabling an alumina film to be formed and to persist on its surface, which film has "adhesive" properties to enhance retention of the outer ceramic layer;

to protect the substrate from corrosion due to oxidation by the oxygen in any ambient medium that has managed to pass through the outer ceramic layer; and to constitute a diffusion barrier against elements of the metal substrate which could contaminate the alumina film, thereby spoiling the interface between the bonding underlayer and the outer ceramic layer, and thus spoiling adhesion thereat.

Including reactive elements such as yttrium, cerium, hafnium, or the lanthanides within the bonding underlayer reinforces the diffusion-barrier function and enhances persistence of the "adhesive" alumina film.

It is well known to form a bonding underlayer of the MCrAlY type (where M is a metal such as Fe, Ni, or Co) by using a physical vapor deposition method, e.g. by plasma sputtering, without giving rise to reaction with the substrate, adhesion between the bonding underlayer and the substrate being of a mechanical nature. By way of example, reference can be made to documents U.S. Pat. No. 4,055,705 and U.S. Pat. No. 5,824,423. Nevertheless, in order to obtain a thermally-stable underlayer, it is necessary for it to be relatively thick, typically not less than 50 micrometers ($\mu$m) to 100 $\mu$m, and that gives rise to a weight penalty.

Other known methods consist in making the bonding underlayer out of an intermetallic compound which can be of smaller thickness due to its thermal stability. An intermetallic compound comprising aluminum and platinum has been found to have good properties.

Thus, U.S. Pat. No. 5,716,720 describes a method consisting in forming a platinum layer electrolytically on a nickel-based superalloy substrate, and subsequently in performing vapor aluminization at a temperature higher than 1000 degrees Celsius (C.). Nickel from the substrate diffuses within the bonding underlayer. An alumina film is formed by heat treatment on the surface of the bonding underlayer prior to forming a ceramic outer layer, e.g. out of ytrried zirconia obtained by physical vapor deposition. A reactive element can be included in the bonding underlayer during the step of vapor aluminization.

U.S. Pat. No. 5,238,752 describes another method which consists in forming a bonding underlayer on a superalloy substrate in which the underlayer comprises an intermetallic compound, in particular a compound of aluminum and platinum. The bonding underlayer is made by pack cementation at a temperature higher than 985° C. and it has a thickness greater than 25 $\mu$m. An alumina film is formed by oxidation on the surface of the bonding underlayer prior to forming the ceramic outer layer, e.g. of yttried zirconia by physical vapor deposition.

Patent application EP 0 985 744 describes yet another method comprising forming a layer of platinum on a nickel-based superalloy substrate by electrodeposition or by chemical vapor deposition and depositing an aluminum layer which is made from a gaseous halide and which diffuses into the platinum layer. Desulfurization and surface descaling is performed after each deposition operation by heat treatment at a temperature higher than 1050° C. in order to eliminate sulfur which is harmful to adhesion of the alumina film that develops on the surface of the resulting bonding underlayer. At that temperature higher than 1050° C., it is inevitable that elements in the substrate will diffuse into the bonding underlayer.

A method of forming a bonding underlayer comprising platinum and aluminum is also described in patent U.S. Pat. No. 5,856,027. A platinum layer is formed on the superalloy substrate by electrodeposition prior to depositing aluminum by chemical vapor deposition, optionally together with reactive elements. The resulting underlayer presents an internal diffusion zone in which nickel diffused from the substrate is present.

With those known methods, the way in which the bonding substrate is formed gives rise to interaction with the substrate. The Applicant has observed that various elements of the superalloy substrate diffusing into the bonding underlayer can form undesirable precipitates therein that are liable in particular to affect the alumina film developed on the surface of the bonding underlayer. In addition, it is difficult to control the precise composition of the bonding underlayer.

OBJECT AND SUMMARY OF THE INVENTION

An object of the invention is to provide a method enabling a protective coating to be formed on a superalloy substrate to form a thermal barrier and including a bonding underlayer made of a chemically stable intermetallic compound comprising aluminum and at least one metal from the platinum group, the bonding underlayer being of controllable composition, being capable of having relatively small thickness, being made substantially without interaction with the substrate that could cause elements of the substrate to diffuse into the bonding underlayer, and being capable of forming on its surface a thin and persistent adhesive film of alumina suitable for bonding an outer ceramic layer.

According to the invention, this object is achieved by the bonding underlayer being formed by using physical vapor deposition to deposit a plurality of individual layers alternately of aluminum and of a metal from the platinum group, and by causing the metals of the resulting layers to react together exothermally.

The term "platinum group" is used herein to mean the group constituted by platinum, palladium, rhenium, ruthenium, osmium, and iridium.

In a physical vapor deposition method, the substrate is heated solely by coming into contact with the cloud of vapor containing the element that is to be deposited. The temperature of the substrate is thus relatively low, since in practice it does not exceed 700° C. The substrate thus remains at a temperature which is well below that at which elements of the substrate are liable to diffuse into the deposit being formed.

It will also be observed that physical vapor deposition methods make it possible to control the thicknesses of the individual deposited layers which, in association with the absence or near absence of any element diffused from the substrate, makes it possible to form a bonding underlayer of precisely controlled composition that is determined by the ratio between the thicknesses of the deposited platinum and aluminum layers.

According to a feature of the method, once the individual layers have been deposited, heat treatment is performed in order to cause the intermetallic compound to be formed by causing the metals of the deposited layers to react together.

Preferably, the heat treatment is performed at a temperature of not more than 900° C. in order to avoid causing elements to diffuse from the substrate.

Also preferably, the heat treatment is performed in a non-oxidizing atmosphere, e.g. in a vacuum or in an inert atmosphere.

According to another feature of the method, the total thickness of the bonding underlayer is less than 50 $\mu$m, typically lying in the range 3 $\mu$m to 30 $\mu$m. This thickness is very significantly smaller than that of prior art underlayers.

The individual layers, at least those of aluminum, are of a thickness that is less than 2000 nanometers (nm), preferably no greater than 1500 nm, and which can be no greater than 200 nm.

Thus, the number of individual layers can vary from a few, typically at least three, to several tens, or indeed several hundreds.

For a given total thickness, when the number of individual layers is relatively small, the bonding underlayer retains a laminated appearance within the resulting coating, but without that having any significant effect on the adhesion thereof.

However, for the same total thickness, when the number of individual layers is relatively great, then the resulting intermetallic compound bonding layer presents a structure that is homogeneous.

The thickness of each individual platinum layer as deposited can remain constant throughout the deposition process, or it can be varied. The same applies to the thickness of the individual layers of aluminum as deposited. In particular, it is possible to deposit several series of aluminum and platinum layers that are individually of relatively small thickness, with these series of layers being spaced apart from one another by at least one layer of platinum plus one layer of aluminum that are individually of relatively great thickness so that after heat treatment the bonding underlayer presents the appearance of a succession of homogeneous phases that are separated from one another.

In addition, and possibly in combination with the above, it is possible to provide for a fixed or varying ratio between the thicknesses of the platinum layers and the aluminum layers as deposited throughout the deposition process so that the intermetallic compound as finally obtained has a composition that is constant or that varies through the thickness of the bonding underlayer.

The individual layers are formed by physical vapor deposition, e.g. by evaporation under electron bombardment or by evaporation under arcing with or without the assistance of a plasma, or indeed by cathode sputtering using at least a first target constituting a source of the metal from the platinum group and a second target constituting a source of aluminum.

According to an additional feature of the method, at least one reactive element selected from yttrium, zirconium, hafnium, and the lanthanides, for example, is deposited in addition to the aluminum and the metal from the platinum group in order to be included in the bonding underlayer. The reactive element can be codeposited with the aluminum and/or with the metal from the platinum group, e.g. by using an alloy as a source.

According to an additional feature of the method, at least one metal other than the aluminum and the platinum can be deposited to further improve thermal stability, e.g. a metal selected from Re, Ni, and Co. This additional metal can be deposited in separate layers or it can be codeposited with the optionally reactive element.

The invention also provides a gas turbine part of the kind that can be obtained by the above method, and more particularly it provides a gas turbine part comprising a superalloy metal substrate, a bonding underlayer formed on the substrate and made of an intermetallic compound comprising aluminum and a metal from the platinum group, an adhesive film of alumina formed on the surface of the bonding underlayer, and an outer coating of ceramic anchored on the alumina film, in which part the bonding underlayer has a thickness of less than 50 $\mu$m, preferably less than 30 $\mu$m.

According to a remarkable feature, the bonding underlayer is free from any elements diffused from the substrate. In other words, the presence of elements from the substrate cannot be detected using the normally available analysis techniques.

BRIEF DESCRIPTION OF THE DRAWINGS

The invention will be better understood on reading the following description given by way of non-limiting indication. Reference is made to the accompanying drawings, in which.

DETAILED DESCRIPTION OF IMPLEMENTATIONS OF THE INVENTION

The description below relates to making a part that comprises a superalloy metal substrate and a protective coating which includes a bonding underlayer made of an intermetallic compound comprising essentially aluminum and platinum, together with a ceramic outer layer anchored by an adhesive alumina film developed on the surface of the bonding underlayer.

Nevertheless, the invention is not limited to making intermetallic compounds made essentially of aluminum and platinum, and it also covers compounds in which the platinum is replaced by another metal in the platinum group, or by an alloy of metals in the platinum group. As mentioned above, the term "platinum group" metal is used herein to mean a metal selected from platinum, palladium, rhenium, ruthenium, osmium, and iridium.

Figure 1:
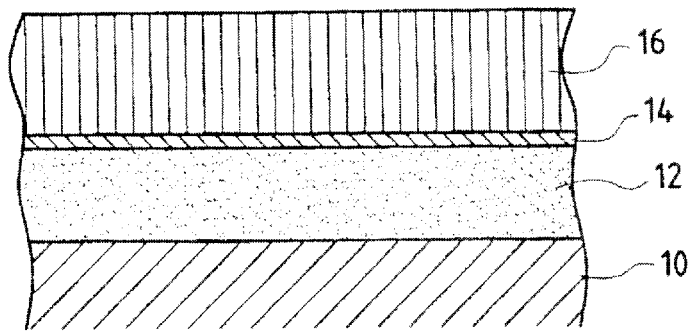
FIG. 1 is a fragmentary view on an enlarged scale of a superalloy metal substrate provided with a protective coating.

FIG. 1 is a highly diagrammatic section through a portion of a part comprising a superalloy metal substrate 10 provided with a protective coating.

Starting from the surface of the substrate, the protective coating comprises a bonding underlayer 12, an alumina film 14 covering the bonding underlayer, and a ceramic outer layer 16 bonded to the alumina film.

In association with the alumina film 14, the bonding underlayer 12 provides bonding between the substrate and the ceramic outer layer, and is made up essentially of an intermetallic compound of aluminum and of platinum, such as $Pt_8A_{21}$, $PtAl_2$, $Pt_2Al_3$, $PtAl$, $Pt_5Al_3$, or a mixture thereof.

Other elements can be added, in particular reactive elements selected from yttrium, zirconium, hafnium and the lanthanides, in order to reinforce the function of providing a diffusion barrier against substrate elements that might be harmful to the behavior of the protective coating, and to encourage persistence of the alumina film 14. Other metals can also be added to have a beneficial effect, e.g. rhenium or indeed nickel and/or cobalt which improves the thermal stability of the coating.

The alumina film 14 is produced by oxidizing the aluminum of the diffusion barrier. It provides protection against corrosion by oxidation. It also serves to bond the ceramic outer coating 16 by virtue of its "adhesive" nature.

The ceramic outer coating 16 serves essentially to provide thermal insulation. It is a refractory oxide such as zirconia, yttrium oxide, or yttried zirconia. It can be formed by physical vapor deposition, e.g. by electron beam evaporation or by plasma-assisted evaporation, as is well known, per se.

The method of the invention relates mainly to forming the bonding underlayer 12.

The bonding underlayer is made up of a plurality of individual layers which are constituted alternately essentially out of platinum and out of aluminum.

The first individual layer to be deposited on the substrate is preferably a layer constituted essentially of platinum, since platinum is less liable to diffuse into the metal substrate than is aluminum. The last individual layer is likewise also preferably a layer constituted essentially of platinum since it is not liable to oxidize in air or under a partial pressure of oxygen at the end of making the bonding underlayer.

Figure 2:
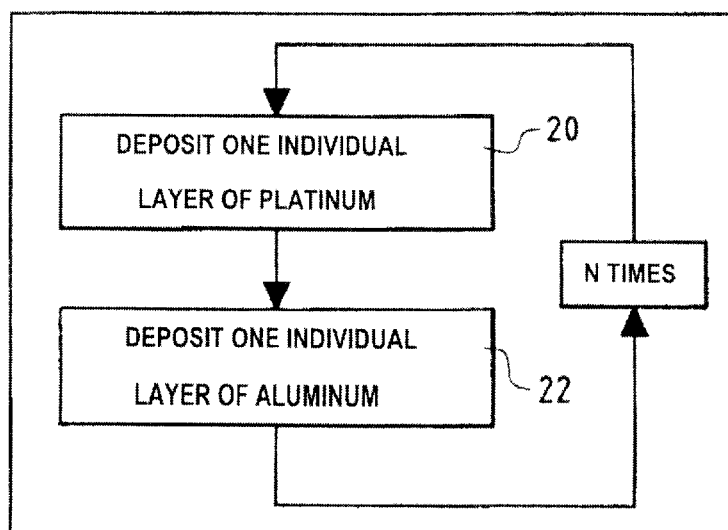
FIG. 2 shows the successive steps in an implementation of the method of the invention.
Figure 2:
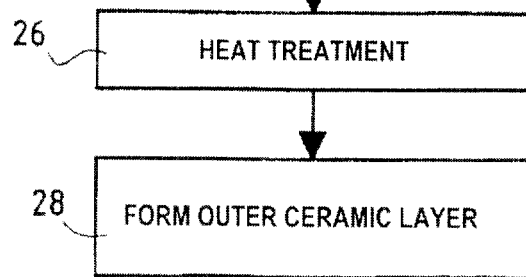

In one implementation of the method (FIG. 2) N individual sequences are performed consecutively, each sequence comprising a stage 20 during which an individual layer of platinum is deposited, followed by a stage 22 in which an individual layer of aluminum is deposited. Immediately after the N sequences have come to an end, a stage 24 is performed of depositing a final individual layer of platinum. The total number of deposited layers is thus equal to 2N+1, where N is an integer equal to or greater than 1.

Thereafter, a heat treatment stage 26 is performed so as to form an intermetallic compound by exothermal reaction between the platinum and the aluminum in the built-up individual layers. The heat treatment is performed at moderate temperature, not more than 900° C., e.g. about 700° C., so that elements from the metal substrate adjacent to the intermetallic compound are not encouraged to diffuse. Heat treatment is performed in a non-oxidizing atmosphere, e.g. in a vacuum or in an inert atmosphere, for a period lying in the range 0.5 hours (h) to 3 h, e.g. about 2 h. During the heat treatment, the aluminum in any one layer diffuses into the adjacent layers of platinum. A fine film of alumina develops on the surface of the resulting bonding underlayer during subsequent exposure to an oxidizing medium.

An outer ceramic layer is then formed on the resulting bonding underlayer (stage 28), accompanied by growth of the alumina film.

The individual layers, at least for the aluminum, are made to have individual thicknesses of less than 2000 nm, and preferably not greater than 1500 nm. This thickness can be selected to be well below this threshold, for example it can be not greater than 200 nm. Such a relatively small thickness is selected whenever it is desired to obtain a homogeneous structure after heat treatment, i.e. a structure in which there remains no trace of the bonding underlayer having been built up in superposed layers.

The number N of sequences is determined as a function of the individual layer thicknesses and of the total thickness desired for the bonding underlayer. This total thickness is advantageously less than 50 $\mu$m, and typically lies in the range 3 $\mu$m to 30 $\mu$m, such that the number 2N+1 of individual layers can vary over the range of several to several tens or indeed several hundreds.

It should be observed that the individual platinum layers and the individual aluminum layers, as deposited, can be of different thicknesses, with the ratio between the total thickness of the platinum layers and the total thickness of the aluminum layers being a function of the stoichiometric ratio desired for the intermetallic compound. The ratio between the thicknesses of the platinum layers and of the aluminum layers can be kept constant or it can be varied in controlled manner during the deposition process. If it is varied, then after heat treatment, a bonding underlayer is obtained in which the composition of the intermetallic compound varies within the thickness of the underlayer. It should also be observed that the thicknesses both of the individual platinum layers and of the individual aluminum layers can be varied during the deposition process while keeping a given ratio between the thicknesses of the platinum and aluminum layers.

In an implementation of the method, the individual platinum and aluminum layers are deposited by cathode sputtering, which method makes it possible to obtain quite precise control over the quantity of metal that is deposited, and thus over the thickness of the individual layers.

Figure 3:
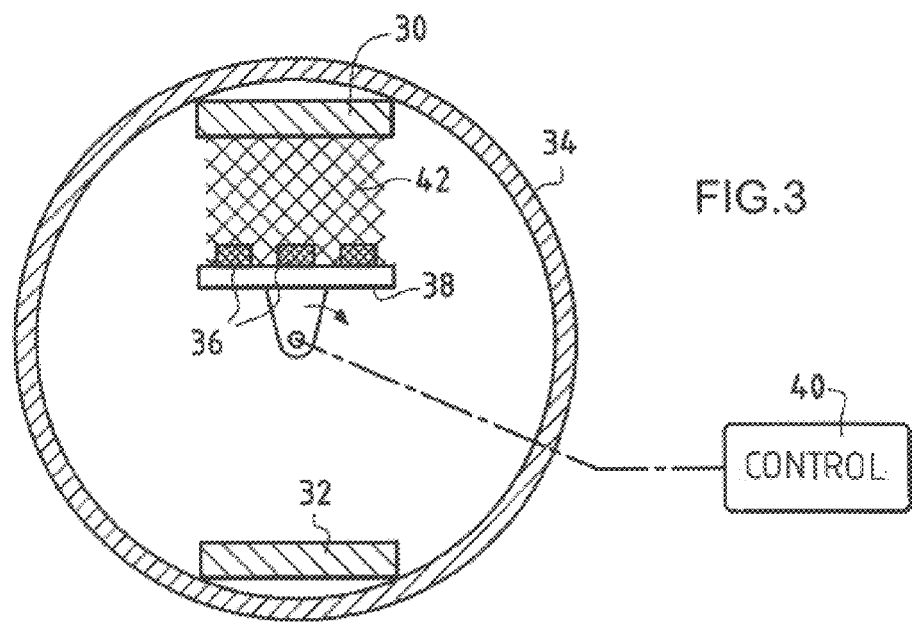
FIG. 3 is a highly diagrammatic view of an installation for physical vapor deposition that is suitable for use when implementing a method according to the invention.

FIG. 3 is a highly diagrammatic view of an embodiment of a cathode sputtering installation suitable for implementing the method.

Targets constituting sources of platinum and of aluminum in the form of solid samples 30 and 32 are fixed on opposite sides of the inside wall of a sealed chamber 34. Parts 36, namely superalloy metal substrates to be coated, are fixed on a part support 38 which is rotatably mounted inside the chamber 34.

The movement of the support 38 is controlled by a programmed control unit 40 acting on a motor (not shown)

which drives the support 38 so as to bring the substrates 36 face to face with the targets 30 and 32 in alternation.

Once the chamber 34 has been evacuated, argon is introduced into the chamber via a duct and the pressure inside the chamber is adjusted to a value of about 1 Pascal (Pa) (i.e. $10^{-2}$ millibars (mbar)).

By establishing a potential difference between the metal substrates and the facing targets, the gas contained in the chamber is ionized, thereby creating a plasma 42. Argon ions are accelerated towards the target and they dislodge metal atoms under the effect of their impact energy. The dislodged metal atoms become deposited on the substrates.

As an indication, cathode sputtering of the aluminum can be performed by applying a radiofrequency (RF) voltage to the target at a power of 350 watts (W) to 450 W. In order to enhance bonding between the first individual layers of platinum and the substrates, the substrates can initially be taken to a negative potential, e.g. −50 volts (V) to −150 V. The potential of the substrates is returned to ground potential during deposition of the following individual layers.

For cathode sputtering of aluminum, the target can be excited by applying a DC voltage to the target, e.g. a voltage lying in the range −250 V to −350 V.

The biasing of the substrates 36 and of the targets 30 and 32, and the durations of the individual deposition stages are controlled by the control unit 40 as a function of a preestablished program in order to obtain a bonding underlayer of desired composition and total thickness.

It is possible to deposit at least one additional metal and/or at least one reactive element within the bonding underlayer by using one or more additional targets.

In order to introduce the additional metal and/or the reactive element in uniform manner throughout the thickness of the bonding underlayer, individual layers can then be formed at regular intervals amongst the set of platinum and aluminum layers by suitably controlling the positioning of the substrates.

It is also possible to associate a source of additional metal and/or of reactive element with one and/or the other of the platinum and aluminum sources.

It is also possible to use a source of platinum and/or a source of aluminum in which the platinum or the aluminum is alloyed with the additional metal and/or the reactive element to be deposited, with the proportions of the components of the alloy being selected as a function of the relative quantity of additional metal and/or reactive element to be introduced in the bonding underlayer.

Physical vapor deposition methods other than cathode sputtering can be used, and they also make it possible to form individual layers of very small thickness while obtaining precise control over their composition. By way of example, such other methods comprise physical gas deposition by electron bombardment (EBPVD) or by evaporation under an arc, with or without assistance from a plasma.

EXAMPLE 1

A nickel-based superalloy metal substrate for a high pressure turbine blade of a turbojet engine was provided with a bonding underlayer made of an intermetallic compound, as follows:

Five individual layers of platinum each having a thickness of about 500 nm were deposited in alternation with four individual layers of aluminum each having a thickness of about 1330 nm. The individual layers were formed by cathode sputtering under the conditions described with reference to FIG. 3.

Figure 4:
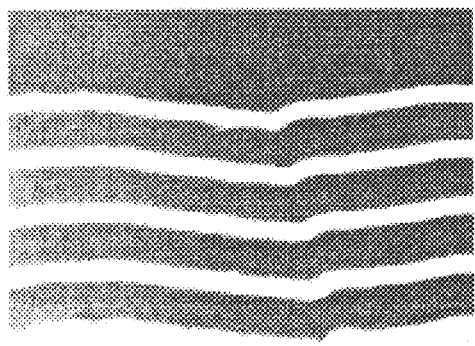
FIGS. 4 and 5 are photomicrographs showing the structure of a bonding underlayer of a protective coating obtained in an implementation of a method according to the invention, before and after heat treatment.

FIG. 4 shows the individual platinum layers (pale color) and the individual aluminum layers (dark color) as obtained after deposition.

Heat treatment was then performed in an inert atmosphere (argon) at a temperature of 700° C. for a period of 2 h. A bonding underlayer having a total thickness equal to about 7.8 μm was obtained and it comprised an intermetallic compound of the $PtAl_2$ type.

Figure 5:
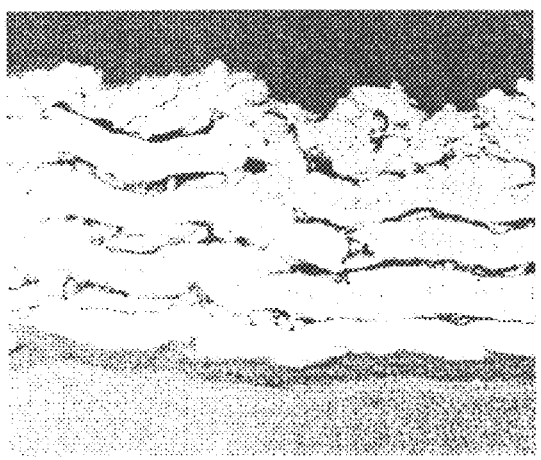

FIG. 5 is a section through the structure of the bonding underlayer. It can be seen that the aluminum has diffused within the layers of platinum and that the laminated nature remained visible.

A conventional type of adhesion test was performed on the bonding underlayer by fixing an adhesive tape to its surface and tearing the tape off. In spite of the laminated structure of the bonding underlayer, good adhesion was observed to the substrate and between the individual intermediate layers.

Quantitative analysis by means of energy dispersion spectroscopy (EDS) showed no diffusion into the bonding underlayer of elements contained in the substrate. The bonding underlayer was thus effective in acting as a diffusion barrier against those elements.

EXAMPLE 2

(For Comparison)

A bonding underlayer having substantially the same total thickness and the same composition as that of Example 1 was formed on a substrate of the same kind as that used in Example 1 and under analogous conditions, except that it was made by depositing three individual layers of platinum each having a thickness of 833 nm in alternation with two individual layers of aluminum each having a thickness of 2650 nm. Adhesion testing performed under the same conditions as in Example 1 revealed poor adhesion to the substrate. In addition, the outer surface of the underlayer presented defects (depressions) revealing localized melting of the aluminum.

EXAMPLE 3

A nickel-based superalloy metal substrate for a high pressure turbine blade of a turbojet engine was provided with an intermetallic thermal barrier underlayer as follows:

Two individual layers of platinum each having a thickness equal to about 1150 nm were deposited on the substrate together with an intermediate layer of aluminum having a thickness of about 1400 nm. The layers were formed by cathode sputtering.

Heat treatment was then performed in an inert atmosphere (argon) at 700° C. for a period of 2 h. The platinum and aluminum layers then reacted exothermally to form an intermetallic compound $Pt_5Al_3$. The underlayer having a total thickness of about 3.7 μm retained a laminated structure.

Analysis performed as in Example 1 showed that the underlayer was made up only of the elements supplied (aluminum and platinum) and did not include any traces of elements from the substrate.

EXAMPLE 4

(For Comparison)

Two individual layers of platinum were deposited on a superalloy substrate identical to that used in Example 3, the layers having a thickness of about 450 nm, and an intermediate layer of aluminum having a thickness equal to about 2000 nm was also deposited. After heat treatment, the laminated structure was friable and its external appearance revealed local melting of the aluminum layer, as in Example 2.

Examples 2 and 4 show that during heat treatment the aluminum melts because the aluminum layer being too thick, it cannot diffuse totally and sufficiently quickly into the platinum to form an intermetallic compound in the platinum which has a higher melting temperature. It is therefore desirable to limit the thickness of the individual layers, in particular the layers of aluminum, in order to encourage rapid formation of an intermetallic compound. The maximum thickness must be less than 2000 nm, and preferably less than 1500 nm.

EXAMPLE 5

A nickel-based superalloy metal substrate for a high pressure turbine blade of a turbojet engine was provided with a bonding underlayer made of an intermetallic compound under the following conditions.

150 individual layers of platinum each having a thickness of about 16 nm were deposited in alternation with 149 individual layers of aluminum each having a thickness of about 35 nm. The individual layers were formed by cathode sputtering under the conditions described with reference to FIG. 3.

Heat treatment was then performed in an inert atmosphere (argon) for a period of 2 h. A bonding underlayer was obtained having a total thickness of about 7.8 $\mu$m and constituted by an intermetallic compound of the $PtAl_2$ type.

Figure 6:
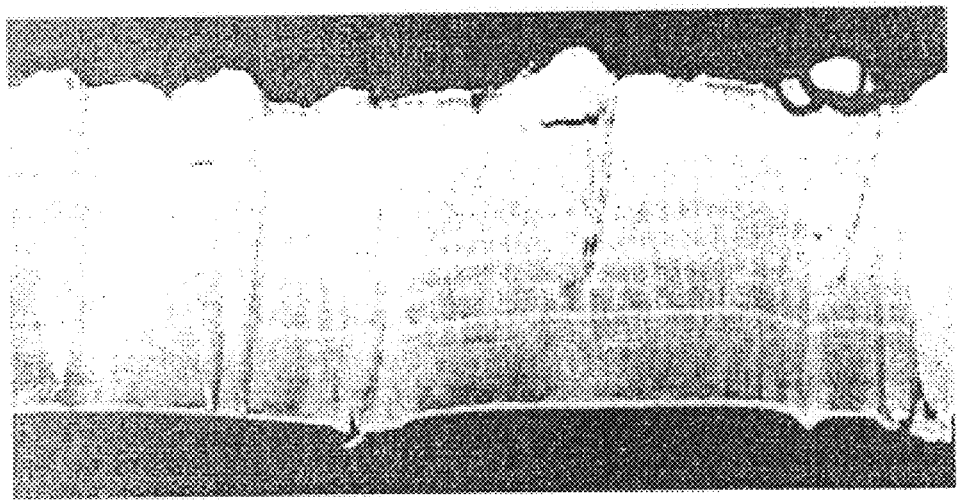
FIGS. 6 and 7 are photomicrographs showing the structure of bonding underlayers obtained using other implementations of a method according to the invention.

FIG. 6 is a section through the structure of the resulting bonding underlayer. It can be seen that the structure is homogeneous and retains no laminated appearance.

Adhesion tests performed as in Example 1 gave very good results.

As in Examples 1 and 3, no element from the substrate was observed to have diffused into the bonding underlayer.

EXAMPLE 6

A nickel-based superalloy metal substrate for a high pressure turbine blade of a turbojet engine was provided with a bonding underlayer comprising an intermetallic compound, under the following conditions:

40 individual layers of platinum each having a thickness equal to about 70 nm were deposited in alternation with 40 individual layers of aluminum each having a thickness equal to about 130 nm and with 40 individual layers of nickel each having a thickness of about 50 nm.

After heat treatment at 900° C. for 2 h in an inert atmosphere, an underlayer with a total thickness of about 10 $\mu$m was obtained by exothermal reaction between the deposited layers. The resulting underlayer was an $NiPtAl_2$ type intermetallic compound and its structure was homogeneous.

EXAMPLE 7

A bonding underlayer having a plurality of stages, or phases, of different compositions was formed on a nickel-based superalloy substrate using the installation of FIG. 3. Each phase was formed by depositing a total of 50 layers of alternating platinum and aluminum, each layer being of relatively small thickness, and adjacent phases were separated by respective pairs of layers, each comprising a platinum layer and an aluminum layer of greater thickness.

In addition, the ratios between the thicknesses of the platinum and aluminum layers in the various phases were given differing values so as to obtain a staged or multiphased underlayer comprising intermetallic compounds of differing compositions at different levels in the underlayer.

More precisely, a pair of layers comprising a 200 nm thick layer of platinum and a 300 nm thick layer of aluminum were formed on the superalloy substrate. Thereafter, 50 alternating layers of platinum and aluminum were deposited thereon. Each individual platinum layer was about 13 nm thick and each individual aluminum layer was about 27 nm thick so that after heat treatment a $PtAl_2$ intermetallic compound was obtained. In the following phases separated by thicker pairs of layers analogous to the first-formed pair, each individual layer of platinum was 20 nm thick and each individual layer of aluminum was about 20 nm thick so as to obtain a PtAl type intermetallic compound. Finally, for the last three phases, likewise separated by pairs of layers of greater thickness analogous to those described above, the compound $Pt_8Al_{21}$, was formed. For this purpose, each individual layer of platinum was about 10 nm thick and each individual layer of aluminum was about 30 nm thick.

Heat treatment was performed at 700° C. for 2 h in order to trigger an exothermal reaction between the individual layers.

Figure 7:
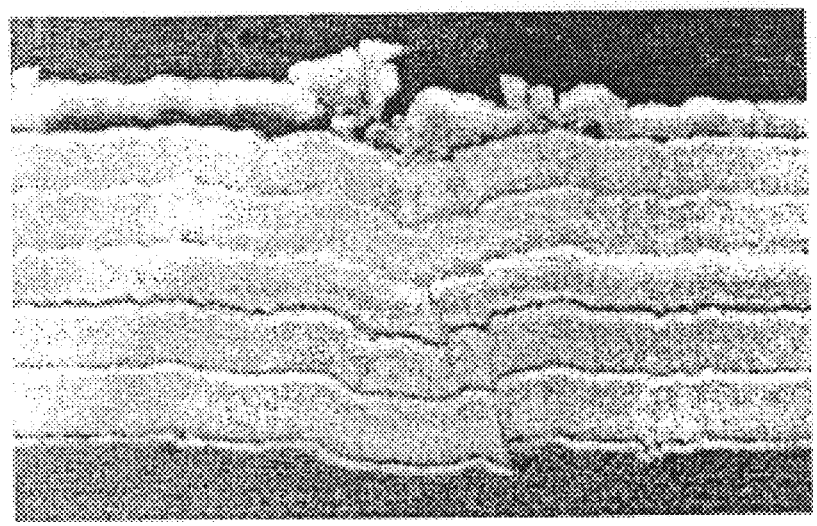

As shown in the section of FIG. 7, the structure of the underlayer obtained after heat treatment was laminated at the thicker layers and homogeneous within the phases formed from thinner layers.

The underlayer was deposited continuously under automatic program control in the FIG. 3 installation.

Although mention is made of forming only a single pair of layers between successive phases of the underlayer, the phases could naturally be separated by forming a plurality of pairs of layers between successive phases or between the substrate and the first phase.

By making a bonding underlayer with staged composition for the intermetallic compound, it is possible to give particular functions to different levels of the underlayer. A reactive element and/or an additional metal can be added in one or more of the phases of the underlayer.

An underlayer of macrostructure that is laminated like that shown in FIG. 7, i.e. having a plurality of distinct superposed stages or phases, makes it possible to interrupt the possible formation of any intermetallic compound columns which could in the long run facilitate migration of elements from the substrate.

Such a laminated macrostructure can also be adopted when the composition of the intermetallic compound is the same in each phase, i.e. when the ratio between the thicknesses of the layers within the phases remains constant (which does not necessarily mean that the thicknesses of the platinum layers and the aluminum layers remain constant).

Naturally, the composition of the intermetallic compound can be varied without periodically depositing thicker pairs of layers, in which case the underlayer can have overall appearance that is homogeneous.

What is claimed is:
1. A method of making a protective coating forming a thermal barrier on a superalloy metal substrate, the method comprising:
  forming a bonding underlayer of an intermetallic compound on the substrate, the underlayer comprising at least aluminum and a metal from the platinum group; and forming a ceramic outer layer which is anchored on an alumina film present on the surface of the bonding underlayer, wherein forming the bonding underlayer comprises using physical vapor deposition to alternately deposit an aluminum layer and a layer of the metal from the platinum group so that at least three layers are formed in total, and causing the resulting layers to react together exothermally.

2. A method according to claim 1, wherein, once the individual layers have been deposited, heat treatment is performed in order to cause the intermetallic compound to be formed by causing the metals of the deposited layers to react together.

3. A method according to claim 2, wherein the heat treatment is performed at a temperature of not more than 900° C.

4. A method according to claim 1, wherein a bonding underlayer is formed having total thickness of less than 50 μm.

5. A method according to claim 4, wherein a bonding underlayer is formed having a total thickness lying in the range 3 μm to 30 μm.

6. A method according to claim 1, wherein individual layers are formed in which at least each aluminum layer is of a thickness of less than 2000 nm.

7. A method according to claim 6, wherein each individual layer is formed with a thickness not greater than 200 nm.

8. A method according to claim 6, wherein individual layers are formed in which at least each aluminum layer is of a thickness of not more than 1500 nm.

9. A method according to claim 1, wherein the first and the last individual layers to be deposited are layers comprising the metal from the platinum group.

10. A method according to claim 1, wherein at least one reactive element is deposited in addition to the aluminum and the metal from the platinum group, in order to include said reactive element in the bonding underlayer.

11. A method according to claim 10, wherein the reactive element is selected from yttrium, zirconium, hafnium, and the lanthanides.

12. A method according to claim 10, wherein the reactive element is codeposited with the aluminum and/or with the metal from the platinum group.

13. A method according to claim 1, wherein the individual layers are formed by cathode sputtering by means of at least a first target constituting a source of the metal from the platinum group and a second target constituting a source of aluminum.

14. A method according to claim 13, wherein a superalloy metal substrate is mounted on a support and the targets and the support are caused to perform relative displacement automatically in order to form the individual layers by exposing the substrate alternately to the first target and to the second target for predetermined durations.

15. A method according to claim 13, wherein at least one target is used constituting a source of reactive element.

16. A method according to claim 15, wherein at least one of the first and second targets includes the reactive element in alloyed form.

17. A method according to claim 13, wherein at least one target is used constituting a source of an additional metal other than Pt or Al.

18. A method according to claim 1, wherein the individual layers of the metal from the platinum group are deposited with varying thicknesses.

19. A method according to claim 1, wherein the individual layers of aluminum are deposited with varying thicknesses.

20. A method according to claim 1, wherein the ratios between the thicknesses of the deposited layers of the metal from the platinum group and of aluminum are caused to vary in controlled manner.

21. A method according to claim 1, wherein the bonding underlayer is made in staged form, with the formation of each stage or phase comprising depositing a plurality of layers of platinum in alternation with layers of aluminum.

22. A method according to claim 21, wherein the ratio between the thicknesses of the layers of platinum and the layers of aluminum takes on different values for different phases.

23. A method according to claim 1, wherein at least one metal other than the aluminum and the metal from the platinum group is deposited in order to be included in the bonding underlayer.

24. A method of making a coating on a superalloy metal substrate comprising:

forming a bonding underlayer comprising at least aluminum and a metal from the platinum group on the substrate, and forming a ceramic outer layer on the bonding underlayer, wherein forming the bonding underlayer comprises:
forming at least one pair of an aluminum layer formed on a platinum group metal layer,
forming a final platinum group metal layer on a last-formed aluminum layer, and
causing the resulting metal layers to react together exothermically.

25. A method of making a coating on a superalloy metal substrate comprising:

forming a bonding underlayer comprising at least aluminum and a platinum group metal on the substrate, and forming a ceramic outer layer on the bonding underlayer, wherein forming the bonding underlayer comprises:
forming an aluminum layer and a platinum group metal layer in an alternating manner, and
performing a heat treatment step of not more than about 900° C. to cause the metal layers to react together exothermically.

26. A method of making a bonding underlayer on a substrate comprising:

forming at least one pair of an aluminum layer on a platinum group metal layer on the substrate, forming a final platinum group metal layer on a last-formed aluminum layer, and causing the resulting metal layers to react together exothermically to obtain the bonding layer and thereby create an alumina film on a surface of the bonding layer, the alumina film being conducive to adhesion with a later-formed protective coat formed on the bonding layer.

* * * * *